(12) United States Patent
Wei et al.

(10) Patent No.: US 11,495,712 B2
(45) Date of Patent: Nov. 8, 2022

(54) LIGHT EMITTING DEVICE, METHOD FOR MAKING THE SAME AND DISPLAY APPARATUS

(71) Applicant: Chengdu Vistar Optoelectronics Co., Ltd., Sichuan (CN)

(72) Inventors: Dong Wei, Sichuan (CN); Xiaolong Yang, Sichuan (CN); Rubo Xing, Sichuan (CN); Xiaowei Li, Sichuan (CN); Enqing Guo, Sichuan (CN); Xuna Li, Sichuan (CN)

(73) Assignee: Chengdu Vistar Optoelectronics Co., Ltd., Chengdu (CN)

( * ) Notice: Subject to any disclaimer, the term of this patent is extended or adjusted under 35 U.S.C. 154(b) by 0 days.

(21) Appl. No.: 17/217,298

(22) Filed: Mar. 30, 2021

(65) Prior Publication Data
US 2021/0217928 A1 Jul. 15, 2021

Related U.S. Application Data

(63) Continuation of application No. PCT/CN2019/093011, filed on Jun. 26, 2019.

(30) Foreign Application Priority Data

Dec. 14, 2018 (CN) .......................... 201811536943.0

(51) Int. Cl.
*H01L 33/36* (2010.01)
*H01L 33/00* (2010.01)
*H01L 33/32* (2010.01)

(52) U.S. Cl.
CPC .......... *H01L 33/36* (2013.01); *H01L 33/0075* (2013.01); *H01L 33/32* (2013.01); *H01L 2933/0016* (2013.01)

(58) Field of Classification Search
CPC ..... H01L 33/36; H01L 33/32; H01L 33/0075; H01L 2933/0016
See application file for complete search history.

(56) References Cited

U.S. PATENT DOCUMENTS

2013/0119424 A1* 5/2013 Kang ...................... H01L 33/50
257/98
2016/0380173 A1 12/2016 Lee et al.

FOREIGN PATENT DOCUMENTS

CN 101241963 A 8/2008
CN 103199187 A 7/2013
(Continued)

OTHER PUBLICATIONS

PCT International Search Report for International Application No. PCT/CN2019/093011 dated Sep. 27, 2019.
(Continued)

*Primary Examiner* — Latanya N Crawford Eason
(74) *Attorney, Agent, or Firm* — Rimon PC

(57) ABSTRACT

The present application provides a light emitting device, a method for making the same and a display apparatus. The light emitting device includes: a driving backplane; at least one set of driving electrodes disposed on the driving backplane, each set of driving electrodes including a first driving electrode and a second driving electrode; an epitaxial layer located on a side of the at least one set of driving electrodes away from the driving backplane; and at least one set of metal electrodes located on a side of the epitaxial layer close to the driving backplane, each set of metal electrodes including a first metal electrode and a second metal electrode, the first metal electrode and the second metal electrode being respectively connected to a first driving electrode and a second driving electrode, and a filling material being disposed between the first metal electrode and the second metal electrode.

20 Claims, 4 Drawing Sheets

(56) References Cited

FOREIGN PATENT DOCUMENTS

| CN | 103682038 | A | | 3/2014 | | |
|---|---|---|---|---|---|---|
| CN | 103887377 | A | | 6/2014 | | |
| CN | 106299040 | A | * | 1/2017 | ......... | H01L 33/0093 |
| CN | 106299040 | A | | 1/2017 | | |
| CN | 106816387 | A | | 6/2017 | | |
| CN | 107464859 | A | | 12/2017 | | |
| JP | 11145562 | A | | 5/1999 | | |
| WO | 2012077884 | A1 | | 6/2012 | | |

OTHER PUBLICATIONS

PCT Written opinion for International Application No. PCT/CN2019/093011 dated Sep. 27, 2019.
Chinese First Office Action for CN Application No. 201811536943.0 dated Oct. 27, 2020.

* cited by examiner

LIGHT EMITTING DEVICE, METHOD FOR MAKING THE SAME AND DISPLAY APPARATUS

CROSS-REFERENCE TO RELATED APPLICATIONS

The present application is a continuation application of International Application No. PCT/CN2019/093011 filed on Jun. 26, 2019, which claims priority to Chinese patent application No. 201811536943.0 filed on Dec. 14, 2018. Both applications are incorporated herein by reference in their entireties.

TECHNICAL FIELD

The present application relates to the field of display technologies, in particular to a light emitting device, a method for making the same and a display apparatus.

BACKGROUND

In preparation processes of GaN-based semiconductor devices, a substrate needs to be stripped off from a GaN layer by using laser stripping-off technology. During a laser stripping-off process, hydrogen gas is easily generated, and a rapid accumulation of hydrogen gas will produce a huge impact force, which easily makes the GaN layer broken.

SUMMARY

In view of this, embodiments of the present application provide a light emitting device, a method for making the same and a display apparatus, which can support a GaN layer during a laser stripping-off process, balance an impact force generated during the laser stripping-off process, avoid fragmentation of the GaN layer and thus improve a yield that a substrate is stripped off by laser.

In a first aspect, the present application provides a light emitting device, including: a driving backplane; at least one set of driving electrodes, disposed on the driving backplane, wherein each set of the at least one set of driving electrodes includes a first driving electrode and a second driving electrode; an epitaxial layer, located on one side of the at least one set of driving electrodes away from the driving backplane; and at least one set of metal electrodes, located on one side of the epitaxial layer close to the driving backplane, each set of the at least one set of metal electrodes including a first metal electrode and a second metal electrode, wherein the first metal electrode and the second metal electrode are respectively connected to a first driving electrode and a second driving electrode, and a filling material is disposed between the first metal electrode and the second metal electrode for filling space between the epitaxial layer and the driving backplane.

In a second aspect, the embodiments of the present application provide a method for making a light emitting device, including: growing an epitaxial layer on a substrate; forming at least one set of metal electrodes on one side of the epitaxial layer away from the substrate, each set of the at least one set of metal electrodes including a first metal electrode and a second metal electrode, and disposing a set of driving electrodes for each set of the at least one set of metal electrodes on a backplane, the set of driving electrodes including a first driving electrode and a second driving electrode, wherein the backplane is a temporary substrate or a driving backplane; filling a filling material between the first metal electrode and the second metal electrode, or filling a filling material between the first driving electrode and the second driving electrode; binding the epitaxial layer and the backplane, so that the first metal electrode and the second metal electrode are respectively connected to the first driving electrode and the second driving electrode, and space between the epitaxial layer and the backplane is filled with the filling material; performing heat treatment of the light emitting device with the substrate, the filling material supporting the epitaxial layer and deforming in an extension direction of a surface where the filling material is located to fill space around the epitaxial layer; and stripping off the substrate by laser.

In a third aspect, the present application provides a display apparatus including the light emitting device as described in the first aspect.

By disposing a filling material between metal electrodes, and using the filling material to fill space between an epitaxial layer and a driving backplane, the epitaxial layer is supported when a substrate is stripped off by laser, which avoids damage or fragmentation of the epitaxial layer caused by excessive impact of laser stripping-off.

DETAILED DESCRIPTION OF THE EMBODIMENTS

The technical solutions in the embodiments of the present application will be clearly and completely described below in conjunction with the accompanying drawings in the embodiments of the present application. Obviously, the described embodiments are only a part of embodiments of the present application, rather than all embodiments. All other embodiments obtained by a person of ordinary skill in the art based on the embodiments of the present application without creative efforts shall fall within the protection scope of the present application.

Figure 1:
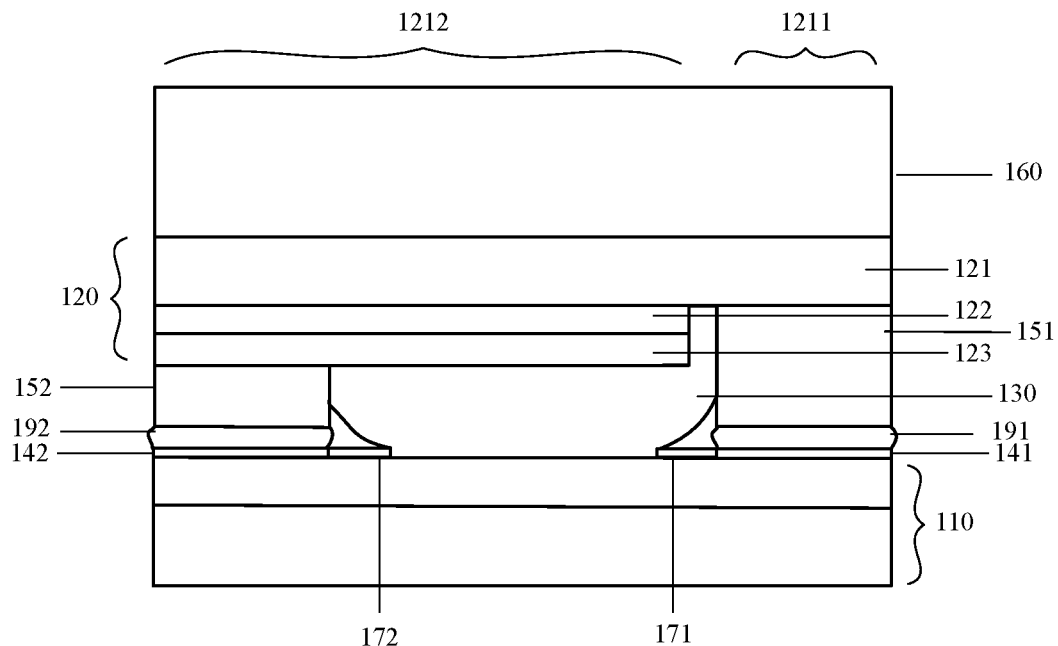
FIG. 1 is a schematic structural diagram illustrating a light emitting device (after heat treatment) according to an embodiment of the present application.

FIG. 1 is a schematic structural diagram illustrating a light emitting device (after heat treatment) according to an embodiment of the present application. As shown in FIG. 1, the light emitting device includes: a driving backplane 110, at least one set of driving electrodes, an epitaxial layer 120, at least one set of metal electrodes, and a filling material 130.

The at least one set of driving electrodes is disposed on the driving backplane 110, and each set of the at least one set of driving electrodes includes a first driving electrode 141 and a second driving electrode 142. The epitaxial layer 120 is located on one side of the at least one set of driving electrodes away from the driving backplane 110. The at least one set of metal electrodes is located on one side of the epitaxial layer 120 close to the driving backplane 110, and each set of the at least one set of metal electrodes includes a first metal electrode 151 and a second metal electrode 152. The first metal electrode 151 and the second metal electrode 152 are respectively connected to a first driving electrode 141 and a second driving electrode 142, and the filling material 130 is provided between the first metal electrode 151 and the second metal electrode 152 for filling space between the epitaxial layer 120 and the driving backplane 110.

Specifically, the epitaxial layer 120 is a GaN epitaxial layer.

In a preparation process of a GaN-based semiconductor device, the GaN epitaxial layer is grown on a substrate first. Therefore, according to an embodiment of the present application, the light emitting device may further include a substrate 160, which can be removed in a later laser stripping-off. The substrate 160 may be a sapphire substrate or a SiC substrate.

One or more sets of metal electrodes may be provided on the epitaxial layer 120. When multiple sets of metal electrodes are provided on the epitaxial layer 120, the epitaxial layer 120 may be a whole or a plurality of independent GaN units formed by cutting. Each GaN unit is provided with a set of metal electrodes, and the number of GaN units may be the same as the number of sets of driving electrodes. The epitaxial layer 120 in the embodiments of the present application is described by taking a GaN unit as an example.

Specifically, materials of the first metal electrode 151 and the second metal electrode 152 may be one or a combination of more of Cr, Pt, Au, Ti, Al, Cu, Ag, Ni, and Mo, respectively, such as Cr/Pt/Au, Ti/Cu, Mo/Al/Mo, Ni/Ag, etc. The materials of the first metal electrode 151 and the second metal electrode 152 may be the same or different. Materials of the first driving electrode 141 and the second driving electrode 142 are similar to that of the metal electrode, and will not be repeated here.

In order to ensure the electrical connection effect between the metal electrode and the driving electrode, a solder may be provided between the metal electrode and the driving electrode. That is, a first solder 191 is provided between the first metal electrode 151 and the first driving electrode 141, and a second solder 192 is provided between the second metal electrode 152 and the second driving electrode 142.

The space between the epitaxial layer 120 and the driving backplane 110 may be filled up with the filling material 130 to support the epitaxial layer 120 when stripping off the substrate 160 by laser generates an impact force. Or, the space between the epitaxial layer 120 and the driving backplane 110 may be filled with the filling material 130, but not full of the filling material 130, that is, there is a certain gap, so that when the impact force is too large, the filling material 130 may deform toward the gap to release a part of the impact force and further avoid damage or fragmentation of the epitaxial layer 120.

Specifically, the filling material may be polyethylene (PE), polyethylene terephthalate (PET), polypropylene (PP), polyimide (PI), polycarbonate (PC), polyvinylidene fluoride (PVDF), polytetrafluoroethylene (PTFE), silica gel, fluorine rubber and other resin materials.

The embodiments of the present application provide a light emitting device, by disposing a filling material between metal electrodes, and using the filling material to fill space between an epitaxial layer and a driving backplane, the epitaxial layer is supported when a substrate is stripped off by laser, which avoids damage or fragmentation of the epitaxial layer caused by excessive impact of laser stripping-off.

Optionally, as another embodiment, as shown in FIG. 1, the surface isolation material is disposed between the filling material 130 and the driving backplane 110. The surface isolation material is a material that is not infiltrated with the filling material 130. The surface isolation material is adjacent to the first driving electrode 141 and/or the second driving electrode 142 to shrink a part of the filling material covering the surface isolation material during heat treatment to form a gap between the filling material 130 and the driving backplane 110.

Figure 2A:
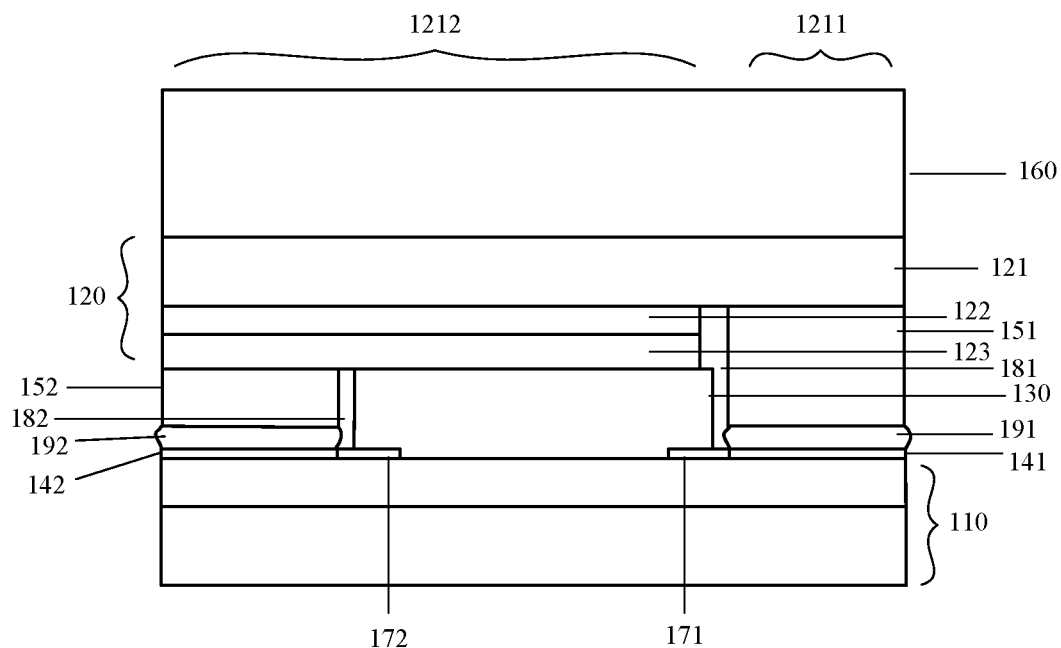
FIG. 2a is a schematic structural diagram illustrating a light emitting device (before heat treatment) according to an embodiment of the present application.

Before the heat treatment of the light emitting device, as shown in FIG. 2a, the surface isolation material covers a part of the filling material 130, so that the part of the filling material 130 in contact with the surface isolation material shrinks during the heat treatment, thereby forming a gap between the filling material 130 and the driving backplane 110, so that when the substrate 160 is stripped off by laser, the filling material 130 is deformed toward the gap to release the impact force.

According to an embodiment of the present application, the surface isolation material may be provided on a partial area of a surface of the driving backplane 110 close to the filling material 130. At this time, the space between the driving backplane 110 and the epitaxial layer 120 is filled with the filling material 130, which is used to support the epitaxial layer 120 when the substrate 160 is stripped off by laser. The filling material 130 is a material that is not infiltrated with the surface isolation material, and shrinks and decreases in volume when heated. In this way, during the heat treatment, the filling material 130 becomes fluid, so that the part of the filling material 130 in contact with the surface isolation material shrinks, leaving a gap. When the impact force generated by stripping off the substrate 160 through laser is too large, the gap allows the filling material 130 to deform toward the gap to release a part of the impact force, thereby further avoiding damage or fragmentation of the epitaxial layer 120.

The surface isolation material may be arranged at the edge of the filling material 130, may be arranged at one place or at multiple places. If the surface isolation material is arranged at multiple places, the size of each place may be the same or different. For example, as shown in FIG. 2a, a first surface isolation material 171 and a second surface isolation material 172 of the same size are respectively arranged near the first driving electrode 141 and the second driving electrode 142, so that a structure of the filling material 130 may be more stable, and the impact force may be released more uniformly when the filling material 130 is deformed, thereby avoiding stress concentration.

Optionally, the surface isolation material may also be disposed between a side surface of the metal electrode and a side surface of the filling material 130, that is, the surface isolation material is perpendicular to the surface of the driving backplane 110 and is disposed close to an inner side of the metal electrode.

According to an embodiment of the present application, the filling material 130 may be a resin material such as PE, PET, PP, PI, PC, PVDF, PTFE, silica gel, fluorine rubber, etc. The surface isolation material may be an inorganic material such as silicon dioxide ($SiO_2$) and silicon nitride (SiN), or an organic material such as octadecyltrichlorosilane (OTS), mercaptan, and silicone rubber. In this embodiment, a gap may be provided around the filling material 130, so that during the heat treatment, the part of the filling material 130 in contact with the first surface isolation material 171 and the second surface isolation material 172 will shrink, and the filling material 130 will expand into the surrounding gap to prevent the filling material 130 from damaging surrounding devices due to excessive expansion. The gap may be set at one or more places around the filling material 130.

A position between the first surface isolation material 171 and the second surface isolation material 172 may be filled with the filling material 130 to ensure a supporting effect of the filling material 130 on the epitaxial layer 120.

The embodiments of the present application are not limited to the specific setting position, shape and quantity of the gap. For example, an irregular gap can be set between the filling material and the surrounding structure, such as a shape of the gap is arc. Optionally, the gap can be set at the edge or corner of the filling material, so that while ensuring a good supporting effect, it also plays a role of buffering impact.

Specifically, as shown in FIG. 1 and FIG. 2a, before the heat treatment, a first gap 181 is provided between the first metal electrode 151 and the filling material 130 and/or a second gap 182 is provided between the second metal electrode 152 and the filling material 130. Apart of the filling material is expandable to fill the first gap 181 and/or the second gap 182 during the heat treatment.

During the heat treatment of the filling material 130, the part of the filling material 130 in contact with the surface isolation material shrinks and expands into the first gap 181 and/or the second gap 182. Setting the first gap 181 and the second gap 182 around the filling material 130 at the same time can make the filling material 130 expand in a direction away from the surface isolation material quickly and uniformly during the heat treatment, and thus avoid large pressures on surrounding devices.

Figure 2B:
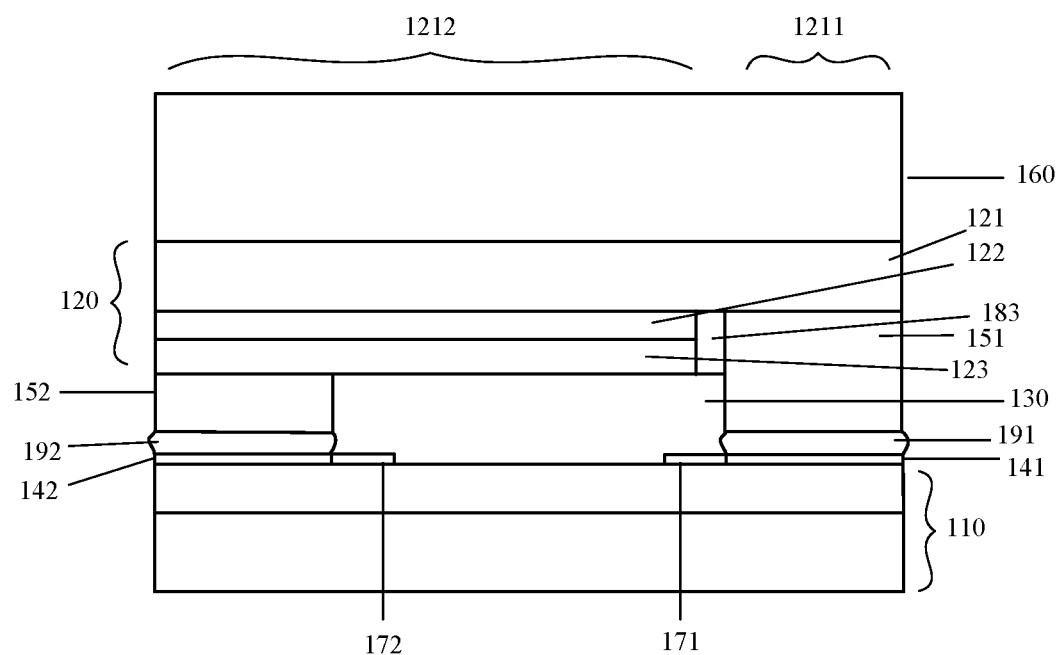
FIG. 2b is a schematic structural diagram illustrating a light emitting device (before heat treatment) according to another embodiment of the present application.

According to an embodiment of the present application, as shown in FIG. 1, the epitaxial layer 120 includes a first semiconductor layer 121, an active layer 122 and a second semiconductor layer 123. A surface of the first semiconductor layer 121 close to the driving backplane 110 is defined with a first area 1211 and a second area 1212. The first metal electrode 151 is disposed between the first area 1211 and the first driving electrode 141, the active layer 122 and the second semiconductor layer 123 are stacked in sequence on the second area 1212, and the second metal electrode 152 is disposed between the second semiconductor layer 123 and the second driving electrode 142. Before the heat treatment, a third gap 183 is formed between the first metal electrode 151 and the active layer 122 as well as between the first metal electrode 151 and the second semiconductor layer 123, as shown in FIG. 2b, and a part of the filling material is expandable to fill the third gap 183 during the heat treatment. In this embodiment, only the third gap 183 may be retained between the driving backplane 110 and the epitaxial layer 120, which can simplify the process.

According to an embodiment of the present application, as shown in FIG. 2a, the first gap 181 is specifically arranged between side surfaces of the active layer 122, the second semiconductor layer 123 and the filling material 130 and a side surfaces of the first metal electrode 151, so that a step of filling a position between the active layer 122 and the first metal electrode 151 as well as between the second semiconductor layer 123 and the first metal electrode 151 may be omitted, which may simplify the process and save materials.

Specifically, as shown in FIG. 2a, the first gap 181 is provided between the side surfaces of the active layer 122, the second semiconductor layer 123 and the filling material 130 and the side surfaces of the first metal electrode 151 and the first solder 191, while the second gap 182 is provided between the side surfaces of the second metal electrode 152 and the second solder 192 and the side surface of the filling material 130. After the heat treatment of the light emitting device, since the filling material 130 is not attached to the surface isolation material, the part of the filling material 130 in contact with the surface isolation material shrinks, thereby leaving a gap near the surface isolation material. At this time, the filling material 130 expands into the first gap 181 and the second gap 182, thereby filling the space near the epitaxial layer 120, as shown in FIG. 1. In this way, the contact area between the filling material 130 and the epitaxial layer 120 may be increased, so that an ability of the epitaxial layer 120 to resist impact force may be enhanced during stripping off the substrate 160 by laser. Moreover, when the impact force is too large and exceeds a supporting capacity of the filling material 130, the filling material 130 may deform toward the gap near the surface isolation material to release part of the impact force and further avoid damage or fragmentation of the epitaxial layer 120.

Figure 3:
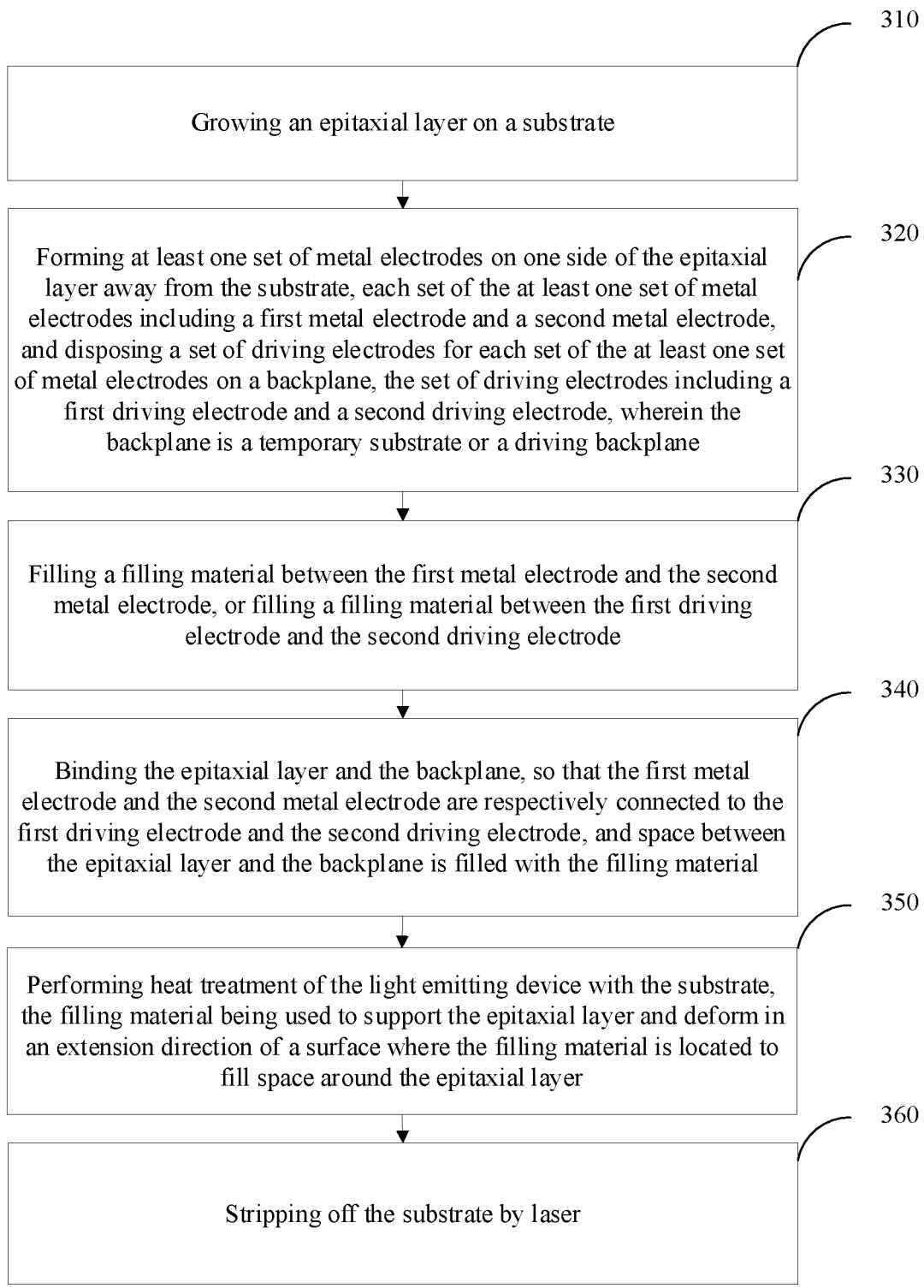
FIG. 3 is a flowchart illustrating a method for making a light emitting device according to an embodiment of the present application.

FIG. 3 is a flowchart illustrating a method for making a light emitting device according to an embodiment of the present application. As shown in FIG. 3, the method includes the following contents.

310: growing an epitaxial layer on a substrate.

320: forming at least one set of metal electrodes on one side of the epitaxial layer away from the substrate, each set of the at least one set of metal electrodes including a first metal electrode and a second metal electrode, and disposing a set of driving electrodes for each set of the at least one set of metal electrodes on a backplane, the set of driving electrodes including a first driving electrode and a second driving electrode, wherein the backplane is a temporary substrate or a driving backplane.

Specifically, the substrate may be a sapphire substrate or a SiC substrate. The materials of the metal electrodes and the driving electrodes, and the structure of the epitaxial layer are similar to the above description about embodiments of FIG. 1 and FIG. 2a, and will not be repeated here. A structure between the substrate and the backplane may be called a light emitting unit. When the backplane is a temporary substrate, the light emitting unit on the temporary substrate may be removed after the substrate is removed and set on an actual backplane, such as a driving backplane.

330: filling a filling material between the first metal electrode and the second metal electrode, or filling a filling material between the first driving electrode and the second driving electrode.

Specifically, the epitaxial layer is a GaN epitaxial layer. After the epitaxial layer is grown on the substrate, multiple sets of metal electrodes may be formed on the epitaxial layer. At this time, the epitaxial layer can be cut into multiple separate GaN units by laser cutting according to each set of metal electrodes. Alternatively, the epitaxial layer can be cut into multiple separate GaN units after the substrate is stripped off by laser. The specific time for cutting the epitaxial layer into multiple separate GaN units can be set according to actual conditions.

For the convenience of description, a set of metal electrodes and a set of driving electrodes on the epitaxial layer are taken as an example for illustration.

340: binding the epitaxial layer and the backplane, so that the first metal electrode and the second metal electrode are respectively connected to the first driving electrode and the second driving electrode, and space between the epitaxial layer and the backplane is filled with the filling material.

Specifically, the filling material may be formed on the epitaxial layer, temporary substrate or driving backplane by means of spin coating, exposing, and imaging, or may be formed on the epitaxial layer, temporary substrate or driving backplane by printing.

Take the driving backplane as an example, the filling material may be set on the driving backplane first, and then the epitaxial layer and the driving backplane may be bound; or, the filling material is set on the epitaxial layer first, and then the epitaxial layer and the driving backplane are bound; alternatively, a part of the filling material is set on the driving backplane and the epitaxial layer respectively, and then the epitaxial layer and the driving backplane are bound. The present application is not limited to the specific method of placing the filling material between the epitaxial layer and the driving backplane.

350: performing heat treatment of the light emitting device with the substrate, the filling material being used to support the epitaxial layer and deform in an extension direction of a surface where the filling material is located to fill space around the epitaxial layer.

360: stripping off the substrate by laser.

Specifically, the purpose of the heat treatment is to shrink the part of the filling material in contact with the surface isolation material to leave a gap, and the filling material expands into the first gap and the second gap. In this way, during stripping off the substrate by laser, the filling material may resist the impact force, support the epitaxial layer. When the impact force is too large, the filling material deforms toward the gap to release part of the impact force, thereby further avoiding damage or fragmentation of the epitaxial layer.

KrF excimer laser or DPSS (Diode Pumped Solid State) laser etc. can be used when stripping off the substrate by laser.

The embodiments of the present application provide a method for making a light emitting device, by disposing a filling material between metal electrodes, and using the filling material to fill space between an epitaxial layer and a driving backplane, the epitaxial layer is supported when a substrate is stripped off by laser, which avoids damage or fragmentation of the epitaxial layer caused by excessive impact of laser stripping-off.

Optionally, as another embodiment, after the filling a filling material between the first metal electrode and the second metal electrode, the method of FIG. 3 further includes: disposing a surface isolation material on a surface of the filling material away from the substrate, or disposing a surface isolation material on a surface of the backplane close to the epitaxial layer, wherein the surface isolation material is a material that is not infiltrated with the filling material, after binding the epitaxial layer and the backplane, the surface isolation material is adjacent to the first driving electrode and/or the second driving electrode, and covers a part of the filling material, and the part of the filling material in contact with the surface isolation material shrinks when performing the heat treatment of the light emitting device with the substrate, thereby forming a gap between the filling material and the backplane.

Specifically, after filling the filling material between the first metal electrode and the second metal electrode, the surface isolation material may be further arranged on the filling material. At this time, a surface of the surface isolation material close to the backplane is flush with a surface of the filling material close to the backplane, and then the epitaxial layer and the backplane are bound. Alternatively, the surface isolation material may be provided on the surface of the backplane close to the epitaxial layer, and then the epitaxial layer and the backplane are bound. The surface isolation material may be set on the backplane by photolithography, printing, evaporation and other methods.

Optionally, as another embodiment, before filling the filling material between the first driving electrode and the second driving electrode of the backplane, a surface isolation material may be provided on the backplane first, then the filling material is set on the backplane and the surface isolation material, and finally the epitaxial layer and the backplane are bound.

The specific position of the surface isolation material in the light emitting device, and the selection of the filling material and the material of the surface isolation material are similar to the above description about embodiments of FIG. 1 and FIG. 2a, and will not be repeated here.

Optionally, as another embodiment, before the heat treatment, a first gap is formed between the filling material and the first metal electrode and/or a second gap is formed between the second metal electrode and the filling material, the part of the filling material in contact with the surface isolation material shrinks when performing the heat treatment of the light emitting device with the substrate, and expands into the first gap and/or the second gap.

Specifically, setting the first gap and the second gap around the filling material at the same time can make the filling material expand in a direction away from the surface isolation material quickly and uniformly during the heat treatment, and avoid large pressures on surrounding devices.

Detailed descriptions of the first and second gaps may be referred to the above description about embodiments of FIG. 1 and FIG. 2a.

The embodiments of the present application are not limited to the specific setting position, shape and quantity of the gap. For example, an irregular gap can be set between the filling material and the surrounding structure, such as a shape of the gap is arc. Optionally, the gap can be set at the edge or corner of the filling material, so that while ensuring a good supporting effect, it also plays a role of buffering impact.

According to an embodiment of the present application, the epitaxial layer includes a first semiconductor layer, an active layer and a second semiconductor layer. Before the heat treatment, a third gap is formed between the first metal electrode and the active layer as well as between the first metal electrode and the second semiconductor layer, the part of the filling material in contact with the surface isolation material shrinks when performing the heat treatment of the light emitting device with the substrate, and expands into the third gap. In this embodiment, the surface isolation material and the filling material may be disposed on the backplane, and only the third gap may be retained between the backplane and the epitaxial layer, which can simplify the process. A specific structure of the epitaxial layer and a specific position of the third gap may be referred to the above description about embodiments of FIG. 1 and FIG. 2b, and in order to avoid repetition, they will not be repeated here.

According to an embodiment of the present application, the first gap is specifically arranged between side surfaces of the active layer, the second semiconductor layer and the filling material and a side surface of the first metal electrode, so that a step of filling a position between the active layer and the first metal electrode as well as between the second semiconductor layer and the first metal electrode may be omitted, and the process may be simplified and materials may be saved.

Figure 4:
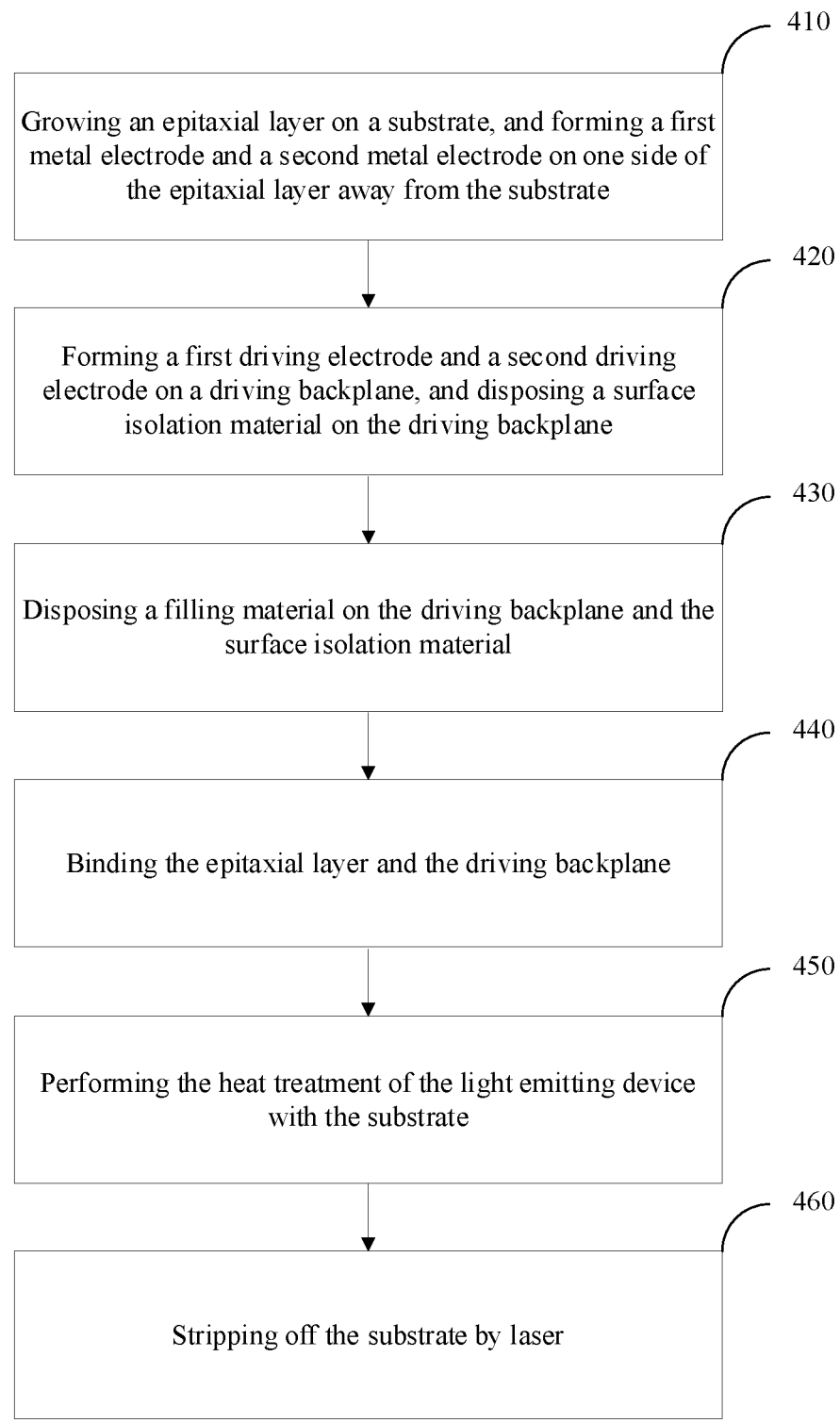
FIG. 4 is a flowchart illustrating a method for making a light emitting device according to another embodiment of the present application.

FIG. 4 is a flowchart illustrating a method for making a light emitting device according to another embodiment of the present application. As shown in FIG. 4, the method includes the following contents.

410: growing an epitaxial layer on a substrate, and forming a first metal electrode and a second metal electrode on one side of the epitaxial layer away from the substrate.

420: forming a first driving electrode and a second driving electrode on a driving backplane, and disposing a surface isolation material on the driving backplane.

Specifically, a first surface isolation material and a second surface isolation material of the same size are respectively arranged near the first driving electrode and the second driving electrode.

430: disposing a filling material on the driving backplane and the surface isolation material.

Specifically, the filling material is provided on the driving backplane and the surface isolation material, and covers a part of the first surface isolation material and a part of the second surface isolation material. That is, a gap is left between the filling material and the first driving electrode, and a gap is left between the filling material and the second driving electrode.

The surface isolation material is a material that is not infiltrated with the filling material. The filling material may be a resin material such as PE, PET, PP, PI, PC, PVDF, PTPE, silica gel, and fluorine rubber; the surface isolation material may be an inorganic material such as $SiO_2$, SiN, or an organic material such as octadecyltrichlorosilane, mercaptan, and silicone rubber.

440: binding the epitaxial layer and the driving backplane.

Specifically, the first metal electrode and the second metal electrode are respectively connected to the first driving electrode and the second driving electrode.

The epitaxial layer includes a first semiconductor layer, an active layer and a second semiconductor layer. A first gap is provided between side surfaces of the active layer, the second semiconductor layer and the filling material and a side surface of the first metal electrode, and a second gap is provided between a side surface of the second metal electrode and a side surface of the filling material. A specific structure of the epitaxial layer and specific positions of the first gap and the second gap may be referred to the description about FIG. 1 and FIG. 2a. To avoid repetition, details are not repeated here.

450: performing the heat treatment of the light emitting device with the substrate.

460: stripping off the substrate by laser.

Specifically, when the heat treatment is performed on the light emitting device with the substrate, the filling material becomes fluid. Since the filling material is not infiltrated with the surface isolation material, the part of the filling material in contact with the surface isolation material shrinks, and other parts of the filling material expand into the first gap and the second gap, which may realize seamless filling of the gap between the epitaxial layer and the first metal electrode, so that the epitaxial layer may be better supported. A temperature of the heat treatment may be selected according to material characteristics of the filling material, which is not limited in the present application.

When the substrate is stripped off by laser, since the filling material seamlessly fills the gaps near the epitaxial layer after heat treatment, the impact force generated during laser stripping-off may be better balanced. In addition, when the impact force is too large and exceeds the bearing capacity of the filling material, the filling material may deform toward the gap created by the shrinkage due to the heat treatment, thereby releasing part of the impact force and avoiding fragmentation of the epitaxial layer.

The embodiments of the present application also provide a display apparatus, which includes the above-mentioned light emitting device. The display apparatus may be an on-vehicle screen, a computer display screen, a smart watch, a smart bracelet, or a television screen. The light emitting device is provided with a filling material between the metal electrodes. By using the filling material to fill the space between the epitaxial layer and the driving backplane, the epitaxial layer is supported when the substrate is stripped off by laser, which avoids damage or fragmentation of the epitaxial layer caused by excessive impact.

The foregoing descriptions are only preferred embodiments of the present application, and are not intended to limit the present application. Any modification, equivalent replacement, etc. made within the spirit and principle of the present application shall be included in the protection scope of the present application.

What is claimed is:

1. A light emitting device, comprising:
   a driving backplane;
   at least one set of driving electrodes, disposed on the driving backplane, wherein each set of the at least one set of driving electrodes comprises a first driving electrode and a second driving electrode;
   an epitaxial layer, located on one side of the at least one set of driving electrodes away from the driving backplane; and
   at least one set of metal electrodes, located on one side of the epitaxial layer close to the driving backplane, each set of the at least one set of metal electrodes comprising a first metal electrode and a second metal electrode,
   wherein the first metal electrode and the second metal electrode are respectively connected to a first driving electrode and a second driving electrode, and a filling material is disposed between the first metal electrode and the second metal electrode for filling space between the epitaxial layer and the driving backplane,
   wherein a surface isolation material is disposed between the filling material and the driving backplane, and a gap is formed between a part of the filling material covering the surface isolation material and the driving backplane after the part of the filling material is shrunk.

2. The light emitting device according to claim 1, wherein the surface isolation material is a material that is not infiltrated with the filling material, and the surface isolation material is adjacent to the first driving electrode and/or the second driving electrode to shrink the part of the filling material covering the surface isolation material during heat treatment to form the gap between the filling material and the driving backplane.

3. The light emitting device according to claim 2, wherein the surface isolation material comprises a first surface isolation material and a second surface isolation material respectively corresponding to the first driving electrode and the second driving electrode, and the first surface isolation material and the second surface isolation material are of the same size.

4. The light emitting device according to claim 3, wherein a space between the first surface isolation material and the second surface isolation material is completely filled with the filling material.

5. The light emitting device according to claim 2, wherein before the heat treatment, a first gap is formed between the first metal electrode and the filling material, and/or a second gap is formed between the second metal electrode and the filling material, and a part of the filling material is expandable to fill the first gap and/or the second gap during the heat treatment.

6. The light emitting device according to claim 2, wherein the epitaxial layer comprises a first semiconductor layer, an active layer and a second semiconductor layer, a surface of the first semiconductor layer close to the driving backplane is defined with a first area and a second area, the first metal electrode is disposed between the first area and the first driving electrode, the active layer and the second semiconductor layer are stacked in sequence on the second area, the second metal electrode is disposed between the second semiconductor layer and the second driving electrode, before the heat treatment, a third gap is formed between the first metal electrode and the active layer as well as between the first metal electrode and the second semiconductor layer, and a part of the filling material is expandable to fill the third gap during the heat treatment.

7. The light emitting device according to claim 5, wherein the epitaxial layer comprises a first semiconductor layer, an active layer and a second semiconductor layer, a surface of the first semiconductor layer close to the driving backplane is defined with a first area and a second area, the first metal electrode is disposed between the first area and the first driving electrode, the active layer and the second semiconductor layer are stacked in sequence on the second area, the second metal electrode is disposed between the second semiconductor layer and the second driving electrode, and the first gap is formed between a side surface of the first metal electrode and side surfaces of the active layer, the second semiconductor layer and the filling material.

8. The light emitting device according to claim 7, wherein a first solder is provided between the first metal electrode and the first driving electrode, a second solder is provided between the second metal electrode and the second driving electrode, the first gap is provided between the side surfaces of the active layer, the second semiconductor layer and the filling material and side surfaces of the first metal electrode and the first solder, and the second gap is provided between side surfaces of the second metal electrode and the second solder and a side surface of the filling material.

9. The light emitting device according to claim 2, wherein the filling material comprises any one of polyethylene, polyethylene terephthalate, polypropylene, polyimide, polycarbonate, polyvinylidene fluoride, polytetrafluoroethylene, silica gel and fluorine rubber, and the surface isolation material comprises any one of silicon dioxide, silicon nitride, octadecyltrichlorosilane, mercaptan and silicone rubber.

10. A method for making a light emitting device according to claim 1, comprising:
growing an epitaxial layer on a substrate;
forming at least one set of metal electrodes on one side of the epitaxial layer away from the substrate, each set of the at least one set of metal electrodes comprising a first metal electrode and a second metal electrode, and disposing a set of driving electrodes for each set of the at least one set of metal electrodes on a backplane, the set of driving electrodes comprising a first driving electrode and a second driving electrode, wherein the backplane is a temporary substrate or a driving backplane;
filling a filling material between the first metal electrode and the second metal electrode, or filling a filling material between the first driving electrode and the second driving electrode;
binding the epitaxial layer and the backplane, so that the first metal electrode and the second metal electrode are respectively connected to the first driving electrode and the second driving electrode, and space between the epitaxial layer and the backplane is filled with the filling material;
performing heat treatment of the light emitting device with the substrate, the filling material supporting the epitaxial layer and deforming in an extension direction of a surface where the filling material is located to fill space around the epitaxial layer; and
stripping off the substrate by laser.

11. The method for making a light emitting device according to claim 10, wherein after the filling a filling material between the first metal electrode and the second metal electrode, the method further comprises:
disposing a surface isolation material on a surface of the filling material away from the substrate, or disposing a surface isolation material on a surface of the backplane close to the epitaxial layer, wherein the surface isolation material is a material that is not infiltrated with the filling material,
after binding the epitaxial layer and the backplane, the surface isolation material is adjacent to the first driving electrode and/or the second driving electrode, and covers a part of the filling material,
and the part of the filling material in contact with the surface isolation material shrinks when performing the heat treatment of the light emitting device with the substrate, thereby forming a gap between the filling material and the backplane.

12. The method for making a light emitting device according to claim 10, wherein before the filling a filling material between the first driving electrode and the second driving electrode, the method further comprises:
disposing a surface isolation material on the backplane, wherein the surface isolation material is a material that is not infiltrated with the filling material,
the surface isolation material is adjacent to the first driving electrode and/or the second driving electrode, and covers a part of the backplane,
and after filling the filling material, a part of the filling material in contact with the surface isolation material shrinks when performing the heat treatment of the light emitting device with the substrate, thereby forming a gap between the filling material and the backplane.

13. The method for making a light emitting device according to claim 11, wherein before the heat treatment, a first gap is formed between the filling material and the first metal electrode and/or a second gap is formed between the second metal electrode and the filling material, the part of the filling material in contact with the surface isolation material shrinks when performing the heat treatment of the light emitting device with the substrate, and expands into the first gap and/or the second gap.

14. The method for making a light emitting device according to claim 11, wherein the epitaxial layer comprises a first semiconductor layer, an active layer and a second semiconductor layer, a surface of the first semiconductor layer close to the backplane is defined with a first area and a second area, the first metal electrode is disposed between the first area and the first driving electrode, the active layer and the second semiconductor layer are stacked in sequence on the second area, the second metal electrode is disposed between the second semiconductor layer and the second driving electrode, before the heat treatment, a third gap is formed between the first metal electrode and the active layer as well as between the first metal electrode and the second semiconductor layer, the part of the filling material in contact with the surface isolation material shrinks when performing the heat treatment of the light emitting device with the substrate, and expands into the third gap.

15. The method for making a light emitting device according to claim 13, wherein the epitaxial layer comprises a first semiconductor layer, an active layer and a second semiconductor layer, a surface of the first semiconductor layer close to the backplane is defined with a first area and a second area, the first metal electrode is disposed between the first area and the first driving electrode, the active layer and the second semiconductor layer are stacked in sequence on the second area, the second metal electrode is disposed between the second semiconductor layer and the second driving electrode, and before the heat treatment, the first gap is formed between a side surface of the first metal electrode and side surfaces of the active layer, the second semiconductor layer and the filling material.

16. A display apparatus, comprising a light emitting device, wherein the light emitting device comprises:
a driving backplane;
at least one set of driving electrodes, disposed on the driving backplane, wherein each set of the at least one set of driving electrodes comprises a first driving electrode and a second driving electrode;
an epitaxial layer, located on one side of the at least one set of driving electrodes away from the driving backplane; and
at least one set of metal electrodes, located on one side of the epitaxial layer close to the driving backplane, each set of the at least one set of metal electrodes comprising a first metal electrode and a second metal electrode, wherein the first metal electrode and the second metal electrode are respectively connected to a first driving electrode and a second driving electrode, and a filling material is disposed between the first metal electrode and the second metal electrode for filling space between the epitaxial layer and the driving backplane, wherein a surface isolation material is disposed between the filling material and the driving backplane, and a gap is formed between a part of the filling material covering the surface isolation material and the driving backplane after the part of the filling material is shrunk.

17. The display apparatus according to claim 16, wherein the surface isolation material is a material that is not infiltrated with the filling material, and the surface isolation material is adjacent to the first driving electrode and/or the second driving electrode to shrink the part of the filling material covering the surface isolation material during heat treatment to form the gap between the filling material and the driving backplane.

18. The display apparatus according to claim 17, wherein before the heat treatment, a first gap is formed between the first metal electrode and the filling material, and/or a second gap is formed between the second metal electrode and the filling material, and a part of the filling material is expandable to fill the first gap and/or the second gap during the heat treatment.

19. The display apparatus according to claim 17, wherein the epitaxial layer comprises a first semiconductor layer, an active layer and a second semiconductor layer, a surface of the first semiconductor layer close to the driving backplane is defined with a first area and a second area, the first metal electrode is disposed between the first area and the first driving electrode, the active layer and the second semiconductor layer are stacked in sequence on the second area, the second metal electrode is disposed between the second semiconductor layer and the second driving electrode, before the heat treatment, a third gap is formed between the first metal electrode and the active layer as well as between the first metal electrode and the second semiconductor layer, and a part of the filling material is expandable to fill the third gap during the heat treatment.

20. The display apparatus according to claim 18, wherein the epitaxial layer comprises a first semiconductor layer, an active layer and a second semiconductor layer, a surface of the first semiconductor layer close to the driving backplane is defined with a first area and a second area, the first metal electrode is disposed between the first area and the first driving electrode, the active layer and the second semiconductor layer are stacked in sequence on the second area, the second metal electrode is disposed between the second semiconductor layer and the second driving electrode, and the first gap is formed between a side surface of the first metal electrode and side surfaces of the active layer, the second semiconductor layer and the filling material.

* * * * *